United States Patent
Jiang et al.

(10) Patent No.: US 10,564,238 B2
(45) Date of Patent: Feb. 18, 2020

(54) SYSTEMS AND METHODS FOR ENERGIZING MAGNETS OF MAGNETIC RESONANCE IMAGING (MRI) SYSTEMS

(71) Applicant: General Electric Company, Schenectady, NY (US)

(72) Inventors: Longzhi Jiang, Florence, SC (US); Venkata K. Mogatadakala, Florence, SC (US); Hua Zhou, Florence, SC (US)

(73) Assignee: General Electric Company, Schenectady, NY (US)

( * ) Notice: Subject to any disclaimer, the term of this patent is extended or adjusted under 35 U.S.C. 154(b) by 1315 days.

(21) Appl. No.: 14/572,865

(22) Filed: Dec. 17, 2014

(65) Prior Publication Data

US 2016/0178717 A1    Jun. 23, 2016

(51) Int. Cl.
*G01R 33/3815*    (2006.01)
*G01R 33/36*    (2006.01)
*G01R 33/385*    (2006.01)

(52) U.S. Cl.
CPC ......... *G01R 33/3815* (2013.01); *G01R 33/36* (2013.01); *G01R 33/3614* (2013.01); *G01R 33/3852* (2013.01)

(58) Field of Classification Search
CPC  G01R 33/3815; G01R 33/36; G01R 33/3852; G01R 33/3614
See application file for complete search history.

(56) References Cited

U.S. PATENT DOCUMENTS

| | | | | |
|---|---|---|---|---|
| 4,656,424 A | * | 4/1987 | Tsur | G01R 33/446 324/309 |
| 6,229,311 B1 | * | 5/2001 | Abenaim | G01R 33/28 324/318 |
| 6,879,852 B1 | | 4/2005 | Mueller | |
| 2001/0024122 A1 | | 9/2001 | Mulder et al. | |
| 2005/0168193 A1 | * | 8/2005 | Xiong | H02J 7/0029 320/134 |
| 2009/0219025 A1 | * | 9/2009 | Fujimoto | G01R 33/341 324/322 |
| 2010/0188083 A1 | * | 7/2010 | Cao | G01R 33/3804 324/307 |
| 2010/0213772 A1 | * | 8/2010 | Zhang | H02H 7/001 307/115 |
| 2010/0295641 A1 | * | 11/2010 | Schild | H01F 6/008 335/216 |
| 2011/0210739 A1 | * | 9/2011 | Ham | G01R 33/28 324/318 |
| 2011/0291657 A1 | | 12/2011 | Davila | |

(Continued)

FOREIGN PATENT DOCUMENTS

WO    2013171611 A1    11/2013

OTHER PUBLICATIONS

International Search Report and Written Opinion for International Application No. PCT/US2015/066001, dated Mar. 31, 2016, 11 pages.

*Primary Examiner* — Dominic E Hawkins (57) ABSTRACT

A magnetic resonance imaging (MRI) system may include a magnet, one or more gradient power amplifiers, one or more radio frequency (RF) power amplifiers, and a single power supply configured to provide power to each of the magnet, the one or more gradient power amplifiers, and the one or more RF power amplifiers.

11 Claims, 6 Drawing Sheets

(56) References Cited

U.S. PATENT DOCUMENTS

| | | | |
|---|---|---|---|
| 2013/0200899 A1* | 8/2013 | Yi | H04L 27/00 |
| | | | 324/322 |
| 2013/0234815 A1* | 9/2013 | Milward | H01F 6/00 |
| | | | 335/216 |
| 2013/0278258 A1 | 10/2013 | Smith et al. | |
| 2014/0009151 A1* | 1/2014 | Van Helvoort | G01R 33/3856 |
| | | | 324/307 |
| 2014/0070812 A1* | 3/2014 | Yokoi | A61B 6/032 |
| | | | 378/4 |
| 2014/0097846 A1* | 4/2014 | Lemaire | G01R 33/3415 |
| | | | 324/322 |

* cited by examiner

SYSTEMS AND METHODS FOR ENERGIZING MAGNETS OF MAGNETIC RESONANCE IMAGING (MRI) SYSTEMS

BACKGROUND

Embodiments of the present disclosure generally relate to magnetic resonance imaging (MRI) systems, and more particularly to systems and methods for energizing magnets of MRI systems.

MRI is a medical imaging modality that generates images of the inside of a human body without using x-rays or other ionizing radiation. MRI or Nuclear Magnetic Resonance (NMR) imaging generally provides for the spatial discrimination of resonant interactions between Radio Frequency (RF) waves and nuclei in a magnetic field. Typically, an MRI system includes a superconducting magnet that generates a main magnetic field within an imaging volume. The MRI system uses various types of radio frequency (RF) coils to create pulses of RF energy. The RF coils transmit RF excitation signals and receive magnetic resonance (MR) signals that the MRI system processes to form the images.

Typically, in order to charge or power a magnet of an MRI system, a separate and distinct standalone service tool, such as a separate and distinct power supply, is connected to the magnet. Known magnet power supplies are large and expensive. Further, delivery time for known magnet power supplies usually takes multiple days. The service tool represents a large acquisition expenditure that requires substantial time to build and deliver to a site. Further, the service tool typically needs regular servicing and maintenance.

Thus, a need exists for an efficient and cost effective system and method of charging, powering, or otherwise ramping up a magnet of an MRI system.

BRIEF DESCRIPTION

Certain embodiments of the present disclosure provide a magnetic resonance imaging (MRI) system that may include a magnet, one or more gradient power amplifiers, one or more radio frequency (RF) power amplifiers, and a power supply configured to provide power to each of the magnet, the one or more gradient power amplifiers, and the one or more RF power amplifiers. The MRI system may also include a cabinet. Each of the magnet, the gradient power amplifier(s), and the RF power amplifier(s) may be contained within the cabinet.

The MRI system may also include a power distribution unit (PDU) connected to the power supply through a main power supply line. The power supply may electrically connect to each of the magnet, the gradient power amplifier(s), and the RF power amplifier(s) through separate and distinct power lines. The power supply may be configured to convert a received AC power signal to a DC power output.

In at least one embodiment, the power supply is configured to exponentially provide power to the magnet over a time period. For example, the power supply may be configured to provide power at an initial level to the magnet and exponentially increase power delivery over time. In at least one embodiment, the power supply may provide an initial level and gradually increase the power level in an exponential fashion.

In at least one embodiment, the power supply may be configured to charge the magnet to a fully-charged state before providing power to the gradient power amplifier(s) and the RF power amplifier(s).

The power supply may include a power correction factor AC-DC converter that connects to a gradient amplifier power circuit, an RF amplifier power circuit, and a magnet power circuit. The gradient amplifier power circuit connects to the gradient power amplifier(s). The RF amplifier power circuit connects to the RF power amplifier(s). The magnet power circuit connects to the magnet.

The magnet power circuit may include a magnet power-controlling circuit. The magnet power-controlling circuit may include a constant voltage regulator, a quench protection circuit, and a constant current regulator. The MRI system may also include a control unit in communication with the magnet power-controlling circuit. The control unit may be configured to monitor a power level of the magnet and operate the magnet power-controlling circuit to deliver power to the magnet when the magnet is not fully charged, and cease delivering power to the magnet when the magnet is fully charged. In at least one embodiment, a DC-DC converter may be disposed between the power supply and the magnet.

Certain embodiments of the present disclosure provide a method of providing power to components of an MRI system. The method may include monitoring a power level of a magnet of the MRI system, delivering power from a single power supply of the MRI system to the magnet when the magnet is not fully charged, ceasing delivery of power from the single power supply of the MRI system to the magnet when the magnet is fully charged, and delivering power from the single power supply to one or more gradient power amplifiers and one or more radio frequency power amplifiers of the MRI system.

DETAILED DESCRIPTION

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be standalone programs, may be incorporated as subroutines in an operating system, may be functions in an installed software package, and the like. It should be understood that the various embodiments are not limited to the arrangements and instrumentality shown in the drawings.

Various embodiments described herein relate generally to instruments for magnetic resonance imaging (MRI) and/or nuclear magnetic resonance (NMR) imaging systems and methods for generating images therefrom. Embodiments of the present disclosure provide a system and method of powering (for example, ramping up) a magnet of an MRI system without a power supply that is separate and distinct from the MRI system. Accordingly, embodiments of the present disclosure provide systems and methods that are efficient and cost-effective, in that they provide considerable time and costs savings in comparison to conventional systems and methods.

Embodiments of the present disclosure provide an MRI system having a main cabinet, which may include a direct current (DC) power supply that is electrically connected for RF and gradient power amplifiers. A power distribution unit may be operatively connected to the DC power supply. The DC power supply draw powers from the PDU. The cabinet may also house a magnet power circuit that is operatively connected between the DC power supply and the magnet. The magnet power circuit is configured to draw power from the PDU through the DC power supply to power the magnet. In at least one embodiment, the DC power supply may include a plurality of outputs, which separately connect to one or more RF power amplifiers, one or more gradient power amplifiers, and the magnet. In at least one other embodiment, the DC power supply connects to a DC-DC converter that converts a received power output to magnet voltage and current outputs.

Embodiments of the present disclosure provide systems and methods of providing power to a magnet of an MRI system without a separate and distinct costly service tool (such as a separate and distinct magnet power supply).

Figure 1:
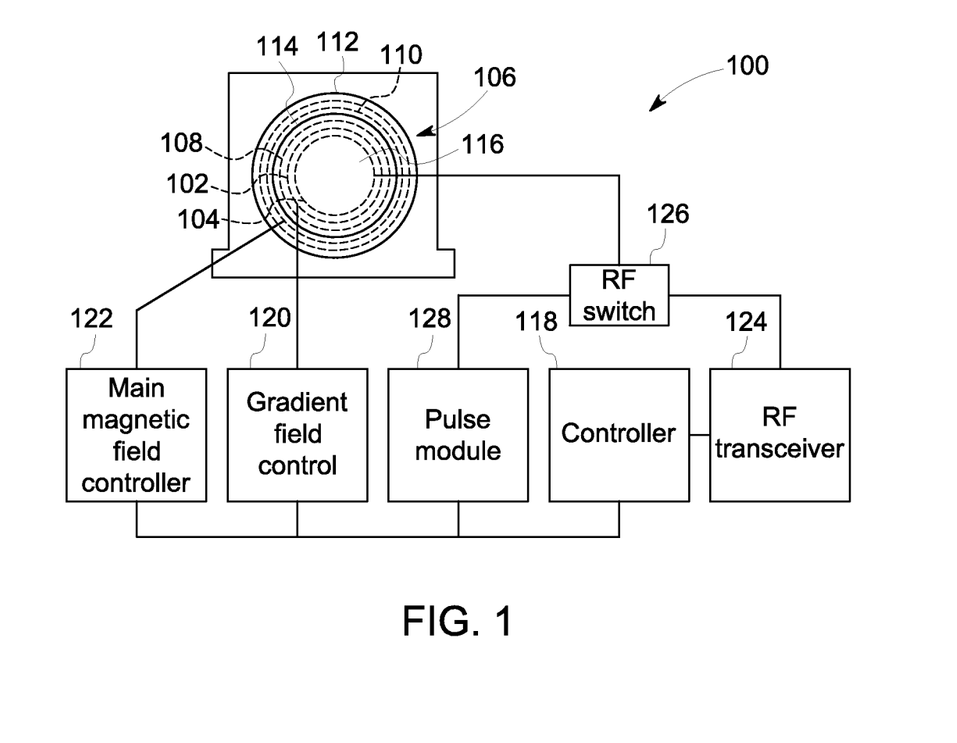
FIG. 1 illustrates a schematic diagram of a magnetic resonance imaging system having RF coils, according to an embodiment of the present disclosure.

FIG. 1 illustrates a schematic diagram of an MRI imaging system 100 having RF coils 102 and 104, according to an embodiment of the present disclosure. The various components described herein may be embodied in an imaging system, such as the imaging system 200 described in relation to FIG. 2. In various embodiments, the imaging system 100 may include a plurality of RF coils, such as the RF coils 102 and 104. The RF coils 102 and 104 may be operatively connected to one or more RF power amplifiers.

In the illustrated embodiment, the MRI imaging system 100 is a single modality MRI imaging system. Alternatively, the imaging system 100 may be implemented in or with multi-modality imaging systems. For example, the imaging system 100 may be combined with different types of medical imaging systems, such as a computed tomography (CT), positron emission tomography (PET), a single photon emission computed tomography (SPECT), as well as an ultrasound system, or any other system capable of generating images, particularly of a human. Moreover, the various embodiments are not limited to medical imaging of human subjects, but may include veterinary or non-medical systems for imaging non-human objects, such as luggage, etc.

The imaging system 100 includes a magnet assembly 106 that includes a superconducting magnet 108. However, in other embodiments, other types of magnets may be used, such as permanent magnets or electromagnets. The superconducting magnet 108 is formed from a plurality of magnetic coils supported on a magnetic coil support structure (not shown). The magnet assembly 106 includes a thermal shield 110 and an outer vacuum vessel 112. A helium vessel 114 surrounds the superconducting magnet 108, and the thermal shield 110 surrounds the helium vessel 114. The outer vacuum vessel 112 surrounds the thermal shield 110. The thermal shield 110, the outer vacuum vessel 112, and the helium vessel 114 form what is known as a cryostat.

In operation, the helium vessel 114 is filled with liquid helium to cool the coils of the superconducting magnet 108. A body of an object to be imaged, such as a patient, is placed in a bore 116 of the superconducting magnet 108. Specifically, the object of interest is situated within the bore 116. The superconducting magnet 108 produces a static main magnetic field along the bore 116 where the patient is located. A controller 118 controls the strength of the main magnetic field through the bore 116, via a main magnetic field controller 122.

The RF coils 102 and 104 may be located about the bore 116 of the magnet 108. For example, the RF coils 102 and 104 may be circumferentially positioned about the bore 116 of the magnet 108. The RF coils 102 and 104 may be selectively oriented with respect to the bore 116 of the magnet 108 to capture RF energy. The RF coils 102 and 104 may be tuned, or selectively configured, to be receptive at select frequencies. The RF coils 102 and 104 transmit RF energy at select frequencies to excite a response from the material of the object being imaged. The RF coils 102 and 104 also receive RF energy at select frequencies to generate RF signal information.

The imaging system 100 may include a plurality of RF coils coupled to a transceiver system 124 and an RF switch 126 controlled by a pulse module 128. The pulse module 128 is operably coupled to the controller 118 to synchronize the operation of the pulse module 128, the magnetic field controller 122, and a gradient field controller 120. For example, the pulse module 128 may send instructions, commands, and/or requests describing the timing, strength, and shape of the RF signals, and pulse sequences to be produced. The transceiver system 124 is operably coupled to the RF coils 102 and 104 via the RF switch 126. The RF switch 126 governs whether the RF coils 102 and 104 are to transmit RF energy or receive RF energy to generate RF signals based on the RF energy. The RF signals are digitized by the transceiver system 124 and are processed (e.g., using a fast Fourier transform) to generate images.

Figure 2:
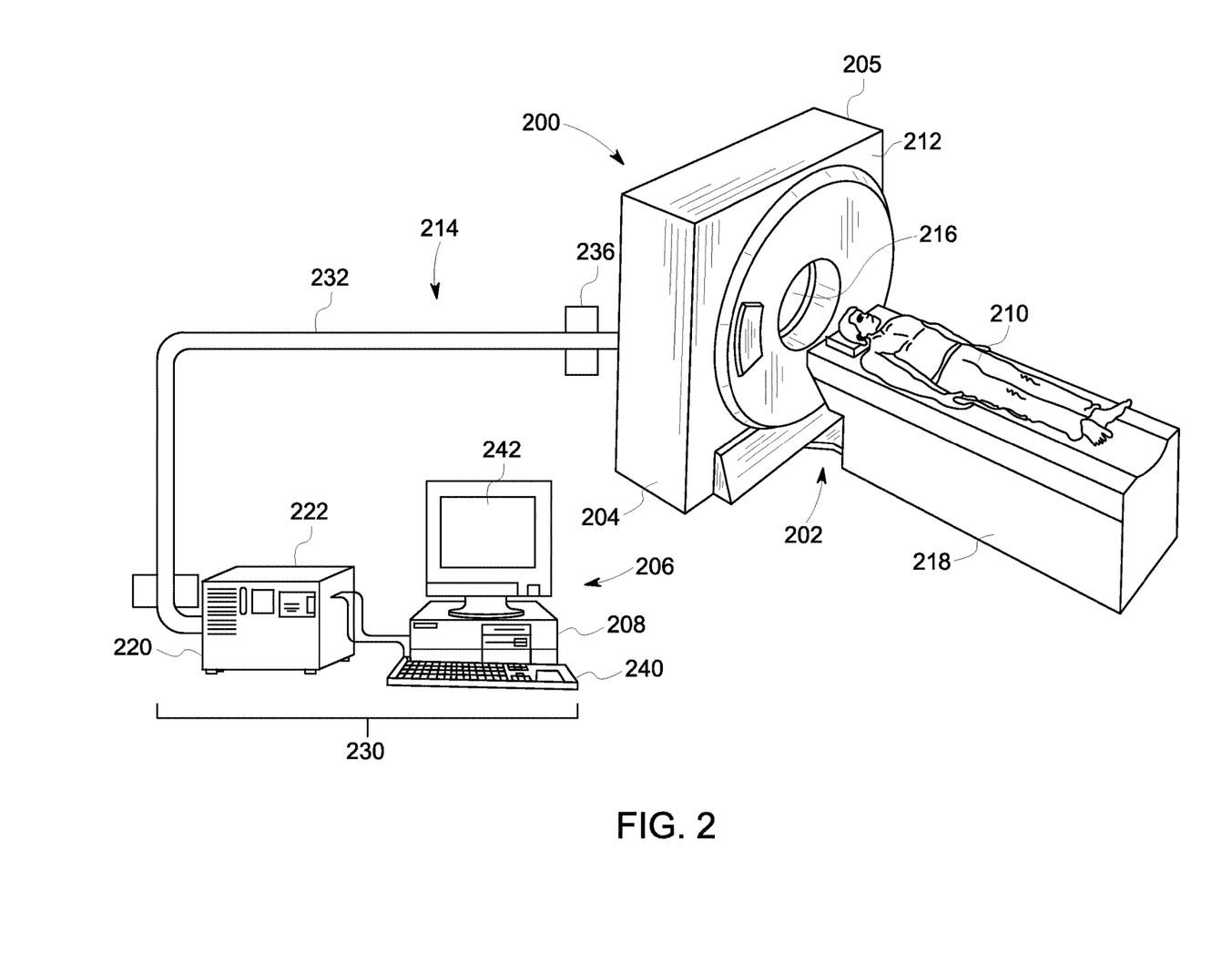
FIG. 2 illustrates a schematic diagram of a medical imaging system, according to an embodiment of the present disclosure.

FIG. 2 illustrates a schematic diagram of a medical imaging system 200, according to an embodiment of the present disclosure. The imaging system 200 includes an imaging portion 202 having an imaging unit 204 (e.g., imaging scanner) and a processing portion 206 that may include a processor 208 or other computing or controller device. The imaging unit 204 may include a main housing 205, such as a cabinet that contains a magnet, RF coils and amplifiers, gradient power amplifiers, and the like. One or more functions performed by the controller 118 and/or the pulse module 128 discussed in relation to FIG. 1, may be performed by the processor 208. In particular, the imaging unit 204 enables the imaging system 200 to scan an object or patient 210 to acquire image data, which may be image data of all or a portion of the object or patient 210. The imaging unit 204 includes a gantry 212 having one or more imaging components (e.g., magnets or magnet windings within the gantry 212) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 206 via a communication link 214 that may be wired or wireless. During an imaging scan by the imaging unit 204, the gantry 212 and the imaging components mounted thereon or therein may remain stationary or rotate about or along a center of rotation defining an examination axis through a bore 216. The patient 210 may be positioned within the gantry 212 using, for example, a motorized table 218.

In operation, an output of one or more of the imaging components is transmitted to the processing portion 206, and vice versa, which may include transmitting signals to or from the processor 208. The processor 208 also may generate control signals for controlling the position of the motorized table 218 or imaging components based on user inputs or a predetermined scan. For example, RF signals or transmit pulses may be communicated through the communication link 214, which may include a coaxial cable 232. It should be noted that the communication link 214 may also include the coaxial cable 232 or a separate communication link may be provided.

During a scan, image data, such as magnetic resonance image data from the imaging components may be communicated to the processor 208 through a data interface 222 via the control interface 220, for example, as acquired by a body coil or surface coil.

The processor 208 and associated hardware and software used to acquire and process data may be collectively referred to as a workstation 230. The workstation 230 may include a keyboard 240 and/or other input devices such as a mouse, a pointer, and the like, and a monitor 242. The monitor 242 displays image data and may accept input from a user if a touchscreen is available.

Figure 3:
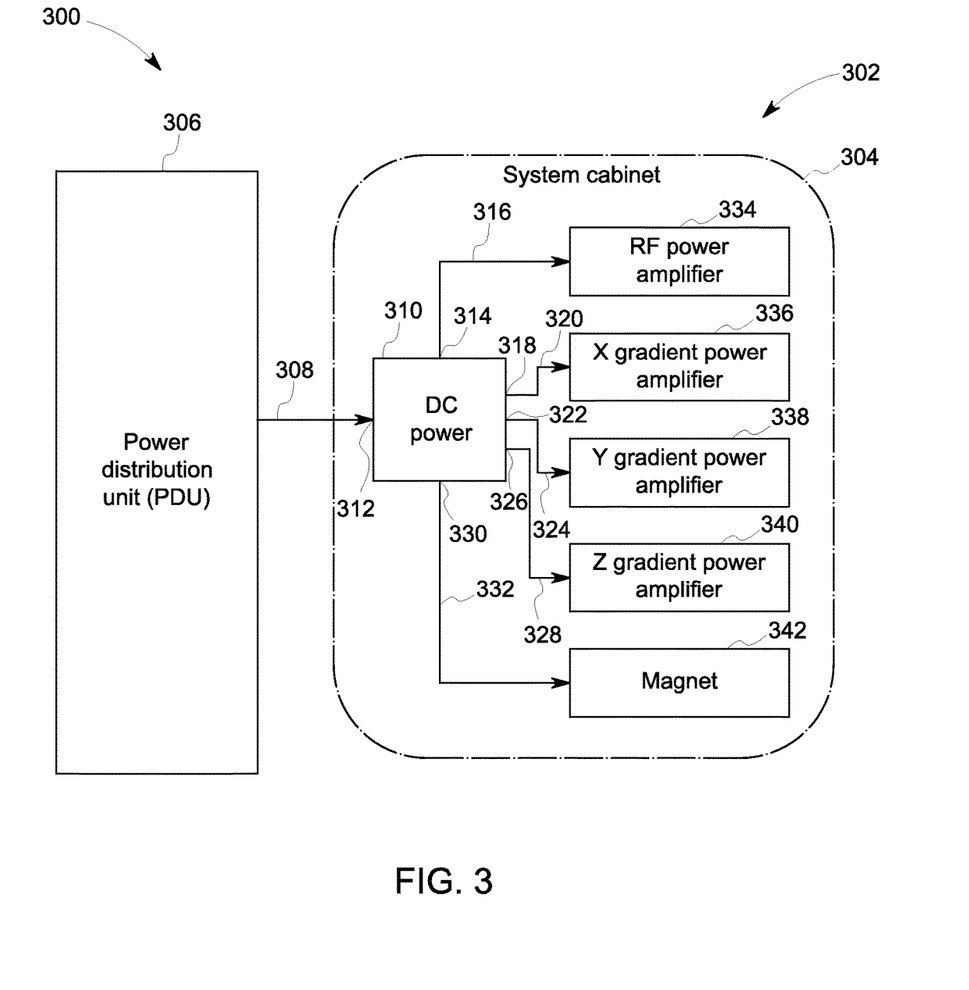
FIG. 3 illustrates a block diagram of a power supply system of an MRI system, according to an embodiment of the present disclosure.

FIG. 3 illustrates a block diagram of a power supply system 300 of an MRI system 302, according to an embodiment of the present disclosure. The MRI system 302 may include a cabinet 304, such as a gantry, housing, or the like that contains various components of the MRI system, connected to a power distribution unit (PDU) 306 through a main power supply line 308, such as a power bus. The PDU 306 may be electrically connected to a power source, such as by way of an electrical cable plugging into a wall power outlet.

The cabinet 304 includes and contains a DC power supply 310 that connects to the PDU 306 through the main power supply line 308. The DC power supply 310 connects to the main power supply line 308 through a power input 312. The DC power supply 310 includes an RF power output 314 connected to an RF power line 316, an X gradient power output 318 connected to an X gradient power line 320, a Y gradient power output 322 connected to a Y gradient power line 324, a Z gradient power output 326 connected to a Z gradient power line 328, and a magnet power output 330 connected to a magnet power supply line 332. The RF power line 316 is connected to an RF power amplifier 334. The X gradient power line 320 is connected to an X gradient power amplifier 336. The Y gradient power line 324 is connected to a Y gradient power amplifier 338. The Z gradient power line 328 is connected to a Z gradient power amplifier 340. The magnet power line 330 is connected to a magnet 342, such as the magnet 108 (shown and described with respect to FIG. 1).

The DC power supply 310 may be similar to a gradient power supply, for example. Thus, instead of a separate and distinct power supplies connected to each of am RF power amplifier, and gradient power amplifiers, as well as a remote service tool power supply connected to a magnet, the single DC power supply 310 is used to power each of the RF power amplifier 334, the gradient power amplifiers 336, 338, and 340, as well as the magnet 342. The single DC power supply 310 receives power from the PDU 306. The RF power amplifier 334, the gradient power amplifiers 336, 338, and 340, and the magnet 342 all draw power from the same DC power supply 310.

In operation, the PDU 308 receives power from a power source, and outputs an alternating current (AC) power signal to the DC power supply 310. The DC power supply 310 converts the AC power signal to DC power signals that are used to power each of the RF power amplifier 334, the X gradient power amplifier 336, the Y gradient power amplifier 338, the Z gradient power amplifier 340, and the magnet 342. In at least one embodiment, the DC power supply 310 outputs a magnet power signal, such as a DC power signal, to the magnet 342 via the magnet power line 332. As such, the single DC supply power supply 310 housed within the cabinet 304 is used to power each and all of the RF power amplifier 334, the X gradient power amplifier 336, the Y gradient power amplifier 338, the Z gradient power amplifier 340, and the magnet 342. Accordingly, power is drawn from the single DC power supply 310 within the cabinet 304 to provide power to all of the components within the cabinet 304 (as opposed to using a separate and distinct service tool, such as a separate and distinct power supply, to power the magnet 342).

Figure 4:
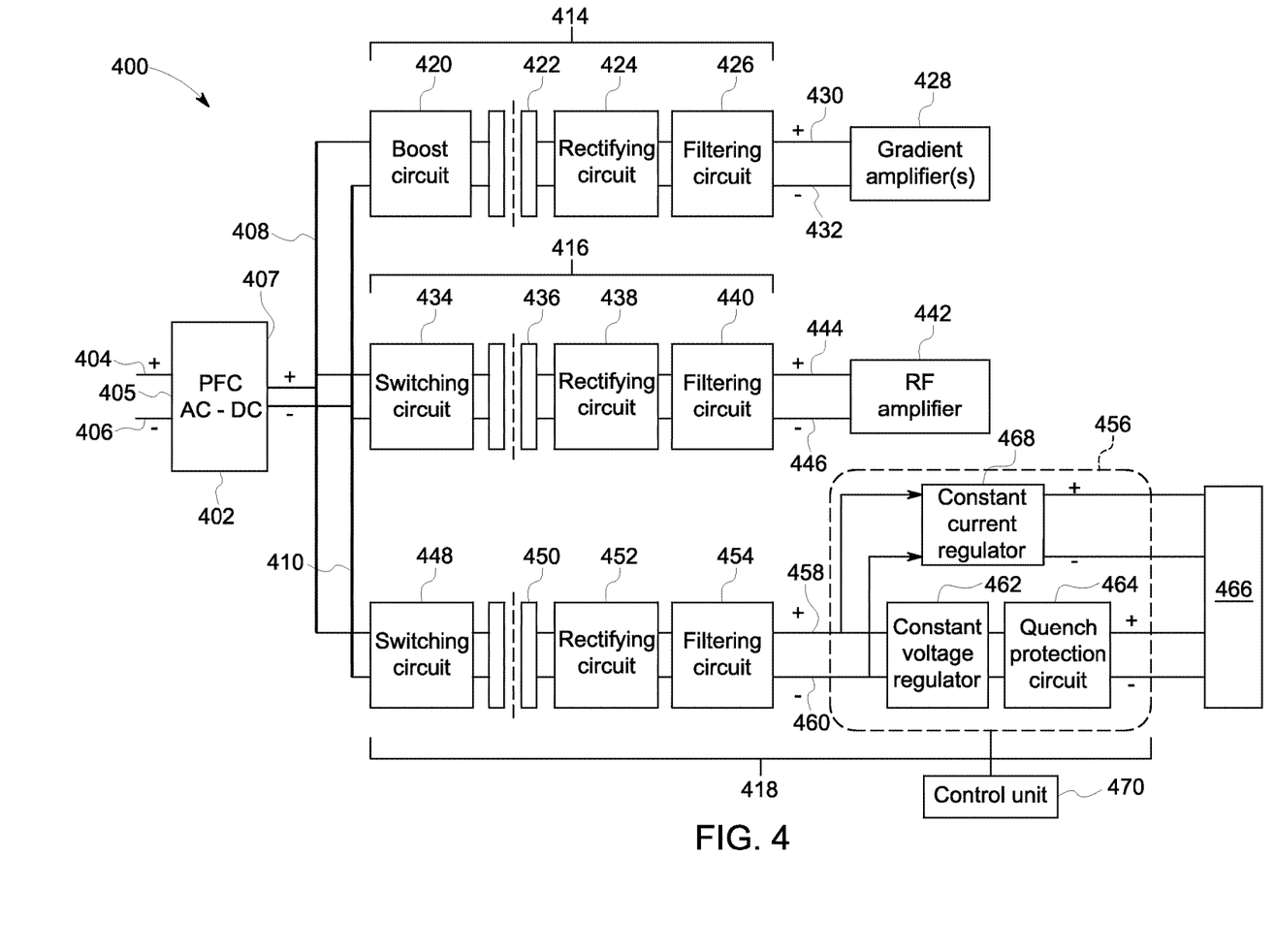
FIG. 4 illustrates a block diagram of a DC power supply, according to an embodiment of the present disclosure.

FIG. 4 illustrates a block diagram of a DC power supply 400, according to an embodiment of the present disclosure. The DC power supply 400 is an example of the DC power supply 310, shown and described with respect to FIG. 3. The DC power supply 400 may include a power correction factor (PFC) AC-DC converter 402, which may connect to a PDU (such as the PDU 306 shown and described with respect to FIG. 3) at an input end 405 through a positive power bus 404 and a negative power bus 406. The PFC AC-DC converter 402 may also include an output end 407 that includes a positive power bus 408 and a negative power bus 410. The positive power bus 408 and the negative power bus 410, in turn, connect to each of a gradient amplifier power circuit 414, an RF amplifier power circuit 416, and a magnet power circuit 418.

The gradient amplifier power circuit 414 may include a boost circuit 420, which may be or include an up converter, connected to a transformer 422, which is, in turn, connected to a rectifying circuit 424, which is, in turn, connected to a filtering circuit 426. The filtering circuit 426 is, in turn, connected to one or more gradient power amplifiers (such as X, Y, Z gradient power amplifiers) through positive and negative power buses 430 and 432.

The RF amplifier power circuit 416 may include a switching circuit 434, which may be or include a buck converter or a down converter. The switching circuit 434, in turn, connects to a transformer 436, which, in turn, connects to a rectifying circuit 438, which, in turn, connects to a filtering circuit 440. The filtering circuit 440 is, in turn, connected to an RF power amplifier 442 through positive and negative power buses 444 and 446.

The magnet power circuit 418 may include a switching circuit 448, which may be or include a buck converter or a down converter. The switching circuit 448 is, in turn, connected to a transformer 450, which is, in turn, connected to a rectifying circuit 452, which, in turn, connects to a filtering circuit 454. The filtering circuit 454 may, in turn, connect to a magnet power-controlling circuit 456, which may connect to the filtering circuit 454 through positive and negative power buses 458 and 460. The magnet power-controlling circuit 456 may include a constant voltage regulator 462 that connects to the power buses 458 and 460. The constant voltage regulator 462 may, in turn, be connected to a quench protection circuit 464, which may in turn connect to a power input of a magnet 466. The magnet power-controlling circuit 456 may also include a constant current regulator 468, which, in turn, connects to the magnet 466. The magnet power-controlling circuit 456 may be operatively connected to a control unit 470, such as one or more computers, processors, modules, or the like, that may be configured to control operation of the magnet power-controlling circuit 456. Alternatively, the magnet power-controlling circuit 456 may not be connected to a control unit.

In operation, the PFC AC-DC converter 402 receives an AC power signal from the PDU (such as the PDU 306 shown in FIG. 3). For example, the AC power signal may be a 208 V AC power signal. The PFC AC-DC converter 402 converts the AC power signal to a DC power signal, which may be split into multiple DC power outputs, such as a gradient power output, an RF power output, and a magnet power output. Each of the power outputs may be delivered to respective power circuits at the same time, at different times, sequentially, or the like. For example, the magnet power output may be delivered to the magnet power circuit 418 before other power outputs are delivered in order to first power up the magnet 466. After the magnet 466 has been powered or otherwise charged, the PFC AC-DC converter 402 may deliver the gradient power output to the gradient amplifier power circuit 414 and/or the RF power output to the RF amplifier power circuit 416.

The DC power output from the PFC AC-DC converter 402 is received by the gradient amplifier power circuit 414. The boost circuit 420 boosts or up-converts the DC gradient power output to a higher voltage. For example, the boost circuit 420 may boost the voltage of the gradient power output to 700V. The transformer 422 and the rectifying circuit 424 then smooth the DC gradient power output. The smoothed DC gradient power output may then be filtered by the filtering circuit 426 to remove spikes, noise, and the like, before being delivered to the gradient power amplifier(s) 428.

The DC power output from the PFC AC-DC converter 402 is received by the RF amplifier power circuit 416. The switching circuit 434 may down-convert the received DC output to a lower voltage, such as 200 V. The transformer 436 and the rectifying circuit 438 then smooth the DC RF power output. The smoothed DC RF power output may then be filtered by the filtering circuit 440 to remove spikes, noise, and the like, before being delivered to the RF power amplifier 442. The gradient power amplifier(s) 428 and the RF power amplifier 442 may be powered in a similar fashion as described in United States Patent Application Publication No. 2011/0291657, entitled "Magnetic Resonance Imaging Compatible Switched Mode Power Supply," which is hereby incorporated by reference in its entirety.

The power output from the PFC AC-DC converter 402 is received by the magnet power circuit 418. The switching circuit 448 may down-convert the received DC signal to a lower voltage, such as 48 V. The transformer 450 and the rectifying circuit 452 then smooth the DC magnet power output. The smoothed DC power output may then be filtered by the filtering circuit 440 to remove spikes, noise, and the like.

The magnet power-controlling circuit 456 receives the smoothed and filtered magnet power output from the filtering circuit 454. A first portion of the magnet power output is drawn by the constant current regulator 468 so that it is operable. For example, the constant current regulator 468 may be or include a relay switch that draws less than 1 amp of current from the magnet power output. When the magnet 466 is not fully charged, the constant current regulator 468 is in a closed position, which allows the magnet power output to be delivered to the magnet 466 through the constant voltage regulator 462 and the quench protection circuit 464. Alternatively, the constant current regulator 468 may be configured so that power is delivered to the magnet 466 when the constant current regulator 468 is in an open position, and not delivered to the magnet 466 when the constant current regular 468 is in a closed position. The magnet power output may be delivered to the magnet at a delivery output of up to 10 V at 800 amps, for example. As the magnet 466 fully charges, the constant current regulator 468 opens, which prevents the magnet power output from being delivered to the magnet 466. In order to protect the voltage regulator 462 during a sudden discharge of energy (quench) from the magnet 466, a quench protection circuit 464, which may be or include a diode assembly, may be positioned between the magnet 466 and the voltage regulator 462. After the magnet 466 is fully charged, the PFC AC-DC converter 402 may cease transmission of the magnet power output to the magnet power circuit 418, and may then deliver the gradient power output and the RF power output to the gradient amplifier power circuit 414 and the RF amplifier power circuit 416, respectively.

The control unit 470 may monitor operation of the magnet power-controlling circuit 456. For example, the control unit 470 may detect when the magnet 466 is fully charged, and then operate the constant current regulator 468 to switch to a position in which the magnet power output is no longer supplied to the magnet 466. Further, the control unit 470 may detect when the magnet 466 is insufficiently charged, and operate the constant current regulator 468 to switch to an opposite position so that the magnet power output is delivered to the magnet 466.

Accordingly, the magnet may be charged from power drawn from the DC power supply 400 that also powers various other components of an MRI system, such as gradient power amplifiers, RF power amplifiers, and the like. The DC power supply 400 receives power from a power source and/or PDU. The various components of the MRI system within the cabinet then draw power from the power signal that is converted by the PFC AC-DC converter 402. As described above, the power supply for the magnet is contained within the cabinet of the MRI assembly, as opposed to a separate and distinct bulky and costly power supply.

The magnet 466 may be powered through the magnet power circuit 418 exponentially over time, for example. For example, the magnet 466 may be exponentially ramped to a fully-powered or charged state over a particular time period. The quench protection circuit 464 and the constant voltage regulator 462 ensure that the magnet 466 is not powered up so quickly (or receive power spikes) as to cause damage to the magnet.

Alternatively, the DC power supply 400 may include more or less of the components shown in FIG. 4. Also, alternatively, the DC power supply 400 may include various other components. For example, the DC power supply 400 may include a down converter that converts a received magnet power output and then directly transmit the down converted magnet power output to the magnet.

Figure 5:
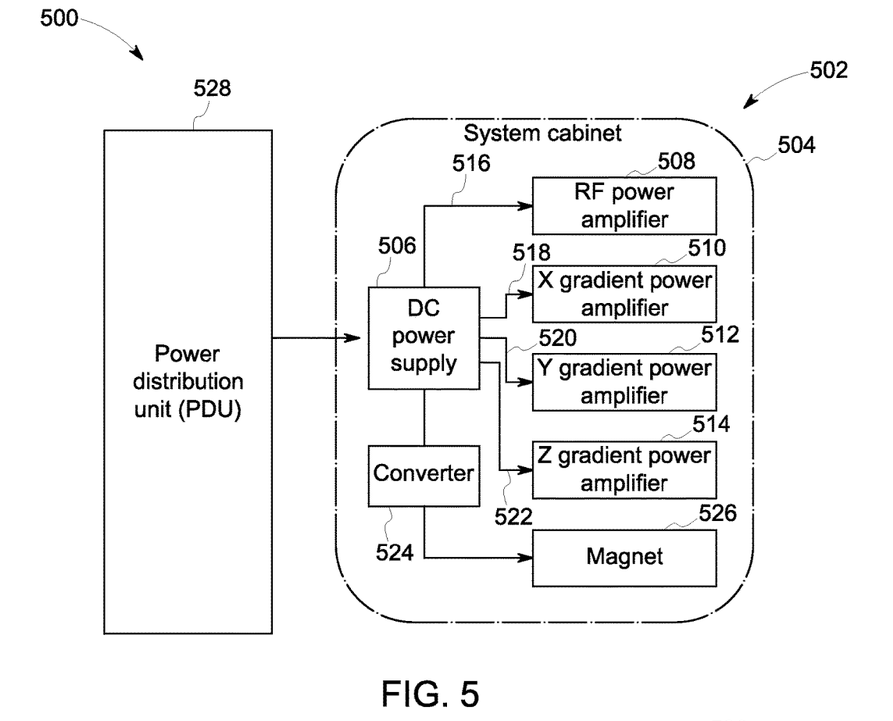
FIG. 5 illustrates a block diagram of a power supply system of an MRI system, according to an embodiment of the present disclosure.

FIG. 5 illustrates a block diagram of a power supply system 500 of an MRI system 502, according to an embodiment of the present disclosure. The power supply system 500 is similar to the system 300 shown and described with respect to FIG. 3. The MRI system 502 includes a cabinet 504 that houses a DC power supply 506 that is connected to an RF power amplifier 508, and gradient power amplifiers 510, 512, and 514 through power supply lines 516, 518, 520, and 522, respectively. The DC power supply 506 is also connected to a DC-DC converter 524, which, in turn, is connected to a magnet 526. The DC power supply 506 connects to a PDU 528, as described above.

Figure 6:
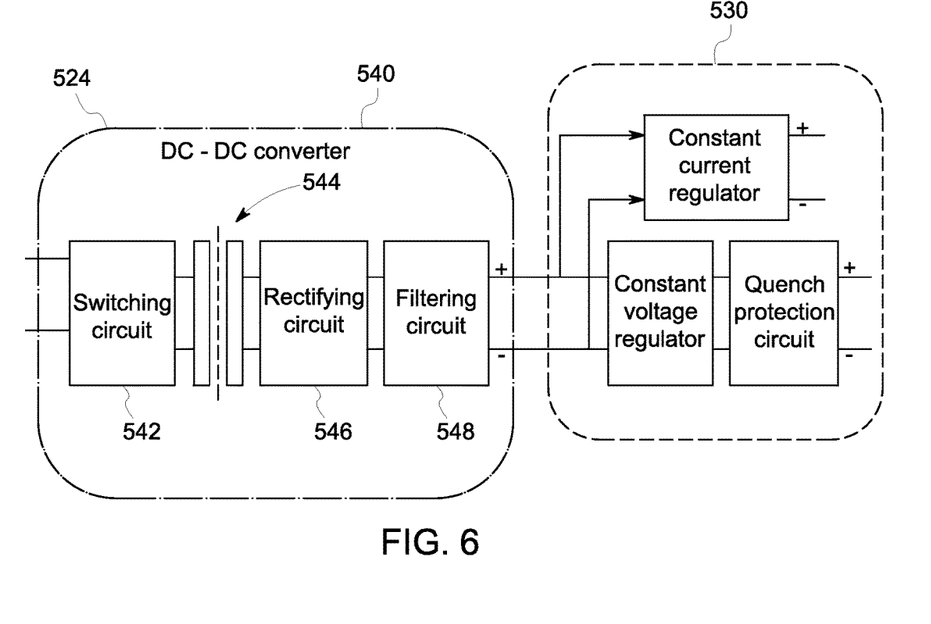
FIG. 6 illustrates a block diagram of a DC-DC converter connected to a magnet power-controlling circuit, according to an embodiment of the present disclosure.

FIG. 6 illustrates a block diagram of the DC-DC converter 524 connected to a magnet power-controlling circuit 530, according to an embodiment of the present disclosure. The magnet power circuit 530 may be similar to the magnet power-controlling circuit 456 shown and described with respect to FIG. 4. The DC-DC converter 524 receives a DC magnet power signal from the DC power supply 506, and may convert the received power signal to a different voltage, such as a lower voltage. The DC-DC converter 524 may include a containing structure 540, such as a housing, that may include a switching circuit 542, a transformer 544, a rectifying circuit 546, and a filtering circuit 548, similar to those described above. As such, the DC-DC converter 524 may provide an intermediary structure between the DC power supply 506 and the magnet power-controlling circuit 530, and may be configured to pre-condition the received DC magnet power signal before being received by the magnet power-controlling circuit 530. The DC-DC converter 524 may convert a gradient power supply output to a suitable magnet voltage and current. A control unit may be operatively connected to the magnet power-controlling circuit 530.

Figure 7:
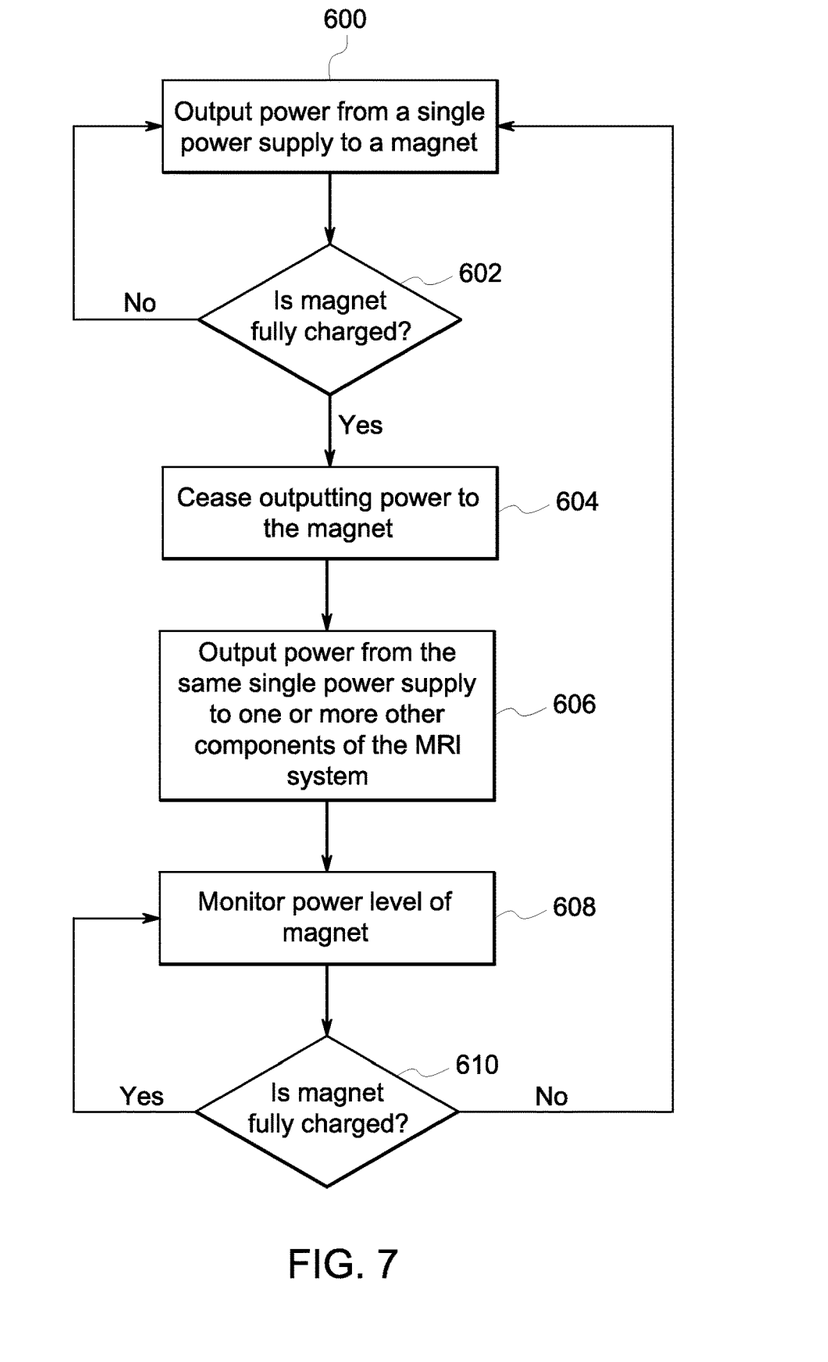
FIG. 7 illustrates a flow chart of providing power to an MRI system, according to an embodiment of the present disclosure.

FIG. 7 illustrates a flow chart of providing power to an MRI system, according to an embodiment of the present disclosure. At 600, power is output from a single power supply to a magnet. The power supply and the magnet may both be housed within the same cabinet, along with various other components of the MRI system.

At 602, it is determined if the magnet is fully charged. For example, a control unit may monitor the power level of the magnet. If the magnet is not fully charged, the method returns to 600. If the magnet is fully charged, the method continues to 604, in which the single power supply ceases output power to the magnet.

At 606, the single power supply outputs power to one or more other components of the MRI system. The other components may be, for example, RF power amplifiers, gradient power amplifiers, and the like housed within the same cabinet as the power supply and the magnet.

At 608, the power level of the magnet is monitored. For example, a control unit may continually monitor the power level of the magnet. At 610, it is determined if the magnet is fully charged. If the magnet is fully charged, the method returns to 608. If the magnet is not fully charged, the method returns to 600.

As described above, embodiments of the present disclosure provide systems and methods for efficiently and cost-effectively providing power to a magnet within an MRI system. The systems and methods may include a single power supply within a cabinet that provides power to the magnet and other components of the MRI system, such as RF and gradient power amplifiers. The single power supply may be integrated into a cabinet that houses or otherwise supports the magnet.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid-state drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A magnetic resonance imaging (MRI) system comprising:
   a power distribution unit (PDU) configured to receive power from an alternating current power source;
   a cabinet;
   a magnet;
   one or more gradient power amplifiers;
   one or more radio frequency (RF) power amplifiers; and
   a DC power supply configured to receive power from the PDU and provide power to the magnet, the one or more gradient power amplifiers, and the one or more RF power amplifiers,
   wherein the magnet, the one or more gradient power amplifiers, the one or more RF power amplifiers, and the DC power supply are contained within the cabinet while the PDU is outside of the cabinet.

2. The MRI system of claim 1, wherein the PDU is connected to the DC power supply through a main power supply line.

3. The MRI system of claim 1, wherein the DC power supply electrically connects to each of the magnet, the one or more gradient power amplifiers, and the one or more RF power amplifiers through separate and distinct power lines.

4. The MRI system of claim 1, wherein the DC power supply is configured to convert a received AC power signal to a DC power output.

5. The MRI system of claim 1, wherein the DC power supply is configured to exponentially provide to the power the magnet over a time period.

6. The MRI system of claim 1, wherein the DC power supply is configured to charge the magnet to a fully-charged state before providing power to the one or more gradient power amplifiers and the one or more RF power amplifiers.

7. The MRI system of claim 1, wherein the DC power supply includes a power correction factor AC-DC converter that connects to a gradient amplifier power circuit, an RF amplifier power circuit, and a magnet power circuit, wherein the gradient amplifier power circuit connects to the one or more gradient power amplifiers, wherein the RF amplifier power circuit connects to the one or more RF power amplifiers, and wherein the magnet power circuit connects to the magnet.

8. The MRI system of claim 7, wherein the magnet power circuit comprises a magnet power-controlling circuit.

9. The MRI system of claim 8, wherein the magnet power-controlling circuit comprises a constant voltage regulator, a quench protection circuit, and a constant current regulator.

10. The MRI system of claim 8, further comprising a control unit in communication with the magnet power-controlling circuit, wherein the control unit is configured to monitor a power level of the magnet and operate the magnet power-controlling circuit to deliver power to the magnet when the magnet is not fully charged, and cease delivering power to the magnet when the magnet is fully charged.

11. The MRI system of claim 1, further comprising a DC-DC converter disposed between the DC power supply and the magnet.

* * * * *